(12) United States Patent
Ikeda et al.

(10) Patent No.: US 11,953,528 B2
(45) Date of Patent: Apr. 9, 2024

(54) DIAGNOSIS SYSTEM, DIAGNOSIS METHOD, PROGRAM, AND RECORDING MEDIUM

(71) Applicant: Panasonic Intellectual Property Management Co., Ltd., Osaka (JP)

(72) Inventors: Kazutaka Ikeda, Nara (JP); Kenta Kamizono, Osaka (JP); Hiroto Nakano, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 363 days.

(21) Appl. No.: 17/282,646

(22) PCT Filed: Nov. 18, 2019

(86) PCT No.: PCT/JP2019/045031
§ 371 (c)(1),
(2) Date: Apr. 2, 2021

(87) PCT Pub. No.: WO2020/144939
PCT Pub. Date: Jul. 16, 2020

(65) Prior Publication Data
US 2021/0349132 A1 Nov. 11, 2021

(30) Foreign Application Priority Data
Jan. 11, 2019 (JP) ................................. 2019-003886

(51) Int. Cl.
*G01R 19/25* (2006.01)
*G01R 19/00* (2006.01)
(Continued)

(52) U.S. Cl.
CPC ...... *G01R 19/2509* (2013.01); *G01R 19/0092* (2013.01); *G01R 19/165* (2013.01); *G01P 15/097* (2013.01); *G01P 21/00* (2013.01)

(58) Field of Classification Search
CPC ............ G01R 19/2509; G01R 19/0092; G01R 19/165; G01R 31/343; G01P 15/097; G01P 21/00
See application file for complete search history.

(56) References Cited

U.S. PATENT DOCUMENTS

2014/0106932 A1* 4/2014 Kato ................... B60W 10/06
477/83
2015/0359476 A1* 12/2015 Hirano .................. A61B 5/721
600/500
(Continued)

FOREIGN PATENT DOCUMENTS

| JP | 2016-090546 A | 5/2016 | |
| JP | 2017-032467 | 2/2017 | |
| WO | WO-2019012730 A1 * | 1/2019 | .......... B61L 15/0081 |

OTHER PUBLICATIONS

International Search Report of PCT application No. PCT/JP2019/045031 dated Dec. 24, 2019. .
(Continued)

*Primary Examiner* — Dominic E Hawkins
(74) *Attorney, Agent, or Firm* — Rimon P.C.

(57) ABSTRACT

A diagnosis system is configured to diagnose an apparatus including a driver device. The system includes an acquisition unit configured to acquire waveform data indicating a waveform related to a current to be supplied to the driver device, and a determination unit configured to determine a condition of the apparatus. The determination unit is configured to obtain, based on the waveform data, a change caused by a component of a force in a particular direction applied to the driver device, and to determine the condition
(Continued)

of the apparatus based on the obtained change. The diagnosis device determines the condition of the apparatus accurately.

32 Claims, 7 Drawing Sheets

(51) Int. Cl.
  *G01R 19/165* (2006.01)
  *G01P 15/097* (2006.01)
  *G01P 21/00* (2006.01)

(56) References Cited

U.S. PATENT DOCUMENTS

| 2016/0236674 | A1* | 8/2016 | Mori | B60W 10/11 |
| 2017/0205276 | A1* | 7/2017 | Araki | G01H 17/00 |
| 2018/0194280 | A1* | 7/2018 | Shibata | G01C 21/3484 |
| 2021/0122048 | A1* | 4/2021 | Kamizono | B25J 9/1653 |

OTHER PUBLICATIONS

English Translation of Chinese Search Report dated Sep. 27, 2023 for the related Chinese Patent Application No. 201980085856.4.

* cited by examiner

DIAGNOSIS SYSTEM, DIAGNOSIS METHOD, PROGRAM, AND RECORDING MEDIUM

CROSS-REFERENCE TO RELATED APPLICATIONS

This application is a U.S. national stage application of the PCT international application No.PCT/JP2019/045031 filed on Nov. 18, 2019, which claims the benefit of foreign priority of Japanese patent application No. 2019-003886 filed on Jan. 11, 2019, the contents all of which are incorporated herein by reference.

TECHNICAL FIELD

The present disclosure relates to a diagnosis system, a diagnosis method, a program and a recording medium for determining a condition of an apparatus.

BACKGROUND ART

PTL 1 discloses an abnormality diagnosis device (diagnosis system) with reduced erroneous diagnosis of an abnormality of a rotating device due to aged degradation. The abnormality diagnosis device disclosed in PTL 1 includes an acceleration sensor as a vibration detection unit that detects vibration generated in a rotating device (driver device), an abnormality diagnosis unit that diagnoses an abnormality of the rotating device, and a vehicle speed sensor that detects a vehicle speed being a traveling speed of a railway vehicle.

CITATION LIST

Patent Literature

PTL 1: Japanese Patent Laid-Open Publication No. 2017-32467

SUMMARY

A diagnosis system is configured to diagnose an apparatus including a driver device. The system includes an acquisition unit configured to acquire waveform data indicating a waveform related to a current to be supplied to the driver device, and a determination unit configured to determine a condition of the apparatus. The determination unit is configured to obtain, based on the waveform data, a change caused by a component of a force in a particular direction applied to the driver device, and to determine the condition of the apparatus based on the obtained change.

The diagnosis device determines the condition of the apparatus accurately.

DETAIL DESCRIPTION OF PREFERRED EMBODIMENT

1. Exemplary Embodiment

1.1 Outline

Figure 1:
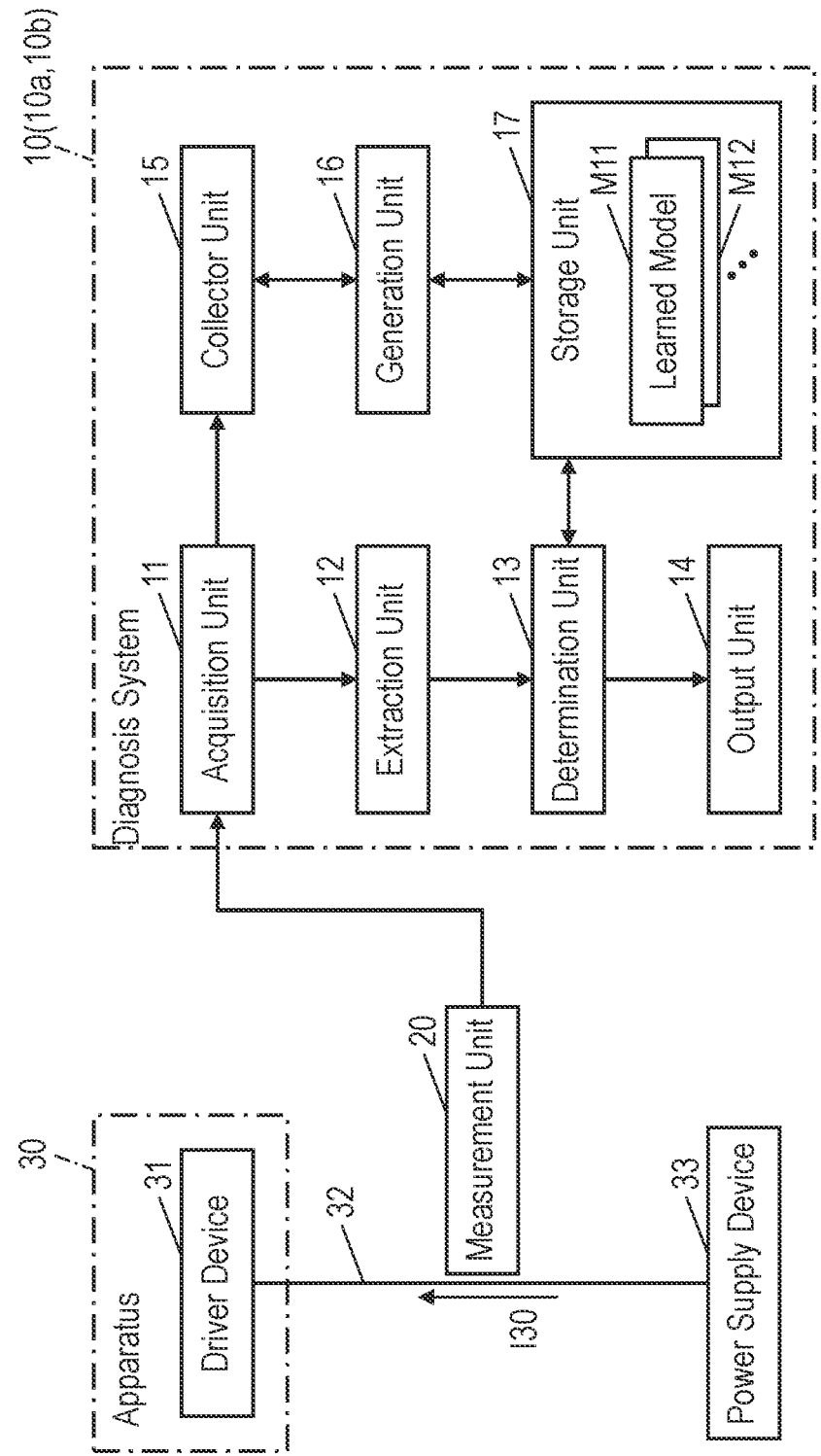
FIG. 1 is a diagram of a diagnosis system according to an exemplary embodiment.

FIG. 1 illustrates diagnosis system 10 according to an exemplary embodiment. Diagnosis system 10 includes acquisition unit 11 and determination unit 13. Acquisition unit 11 is configured to acquire waveform data indicating a waveform related to current I30 supplied to driver device 31 of apparatus 30. Determination unit 13 is configured to determine the condition of apparatus 30 based on a change caused by a component of a force in a specific direction applied to driver device 31. The change is obtained based on the waveform data.

In apparatus 30, the condition of apparatus 30 has a correlation with the change caused by the component of the force in the specific direction applied to driver device 31. Diagnosis system 10 determines the condition of apparatus 30 based on the waveform data indicating a waveform related to current I30 supplied to driver device 31 of apparatus 30. In diagnosis system 10, when determining the condition of apparatus 30, the waveform data indicating the waveform related to current I30 supplied to driver device 31 may be obtained. Therefore, differing from a case where a sensor is installed near driver device 31, determination of the condition of apparatus 30 is less influenced by environment around driver device 31. Thus, diagnosis system 10 accurately determines the condition of apparatus 30.

In the diagnosis device disclosed in PTL 1, an acceleration sensor is arranged near a multiple-row tapered roller bearing in order to detect the vibration generated in the rotating device. However, since the acceleration sensor (sensor) is provided near the rotating device (driver device), various influences by the surrounding environment (ambient temperature, and the like) of the rotating device are applied to the sensor. This may decrease the accuracy of determining the condition of the apparatus.

Diagnosis system 10 in the exemplary embodiment, as described above, improves the accuracy of determining the condition of apparatus 30.

1.2 Details

Diagnosis system 10 will be described below in more detail. Diagnosis system 10 is configured to diagnose apparatus 30. Apparatus 30 to be diagnosed by diagnosis system 10 is, for example, a work device. The work device is a device that executes a predetermined work. Examples of the predetermined work include machining, transporting, arranging, and mounting of materials and articles. The machining may include, for example, physical processing such as boring, drilling, screwing, cutting, polishing, and chemical processing such as heating and cooling. The transportation is not limited to the transportation of solid articles such as components and products, but also includes the transportation of a fluid in a flow path. As such a work device, machine tools such as lathes, machining centers, end mills, grinders, and drills, component mounting machines, transporters, heat treatment devices, pumps (for example, vacuum pumps), compressors, and polishing devices (for example, chemical-mechanical polishing device), and combinations thereof are exemplified.

1.2.1 Apparatus

Figure 2:
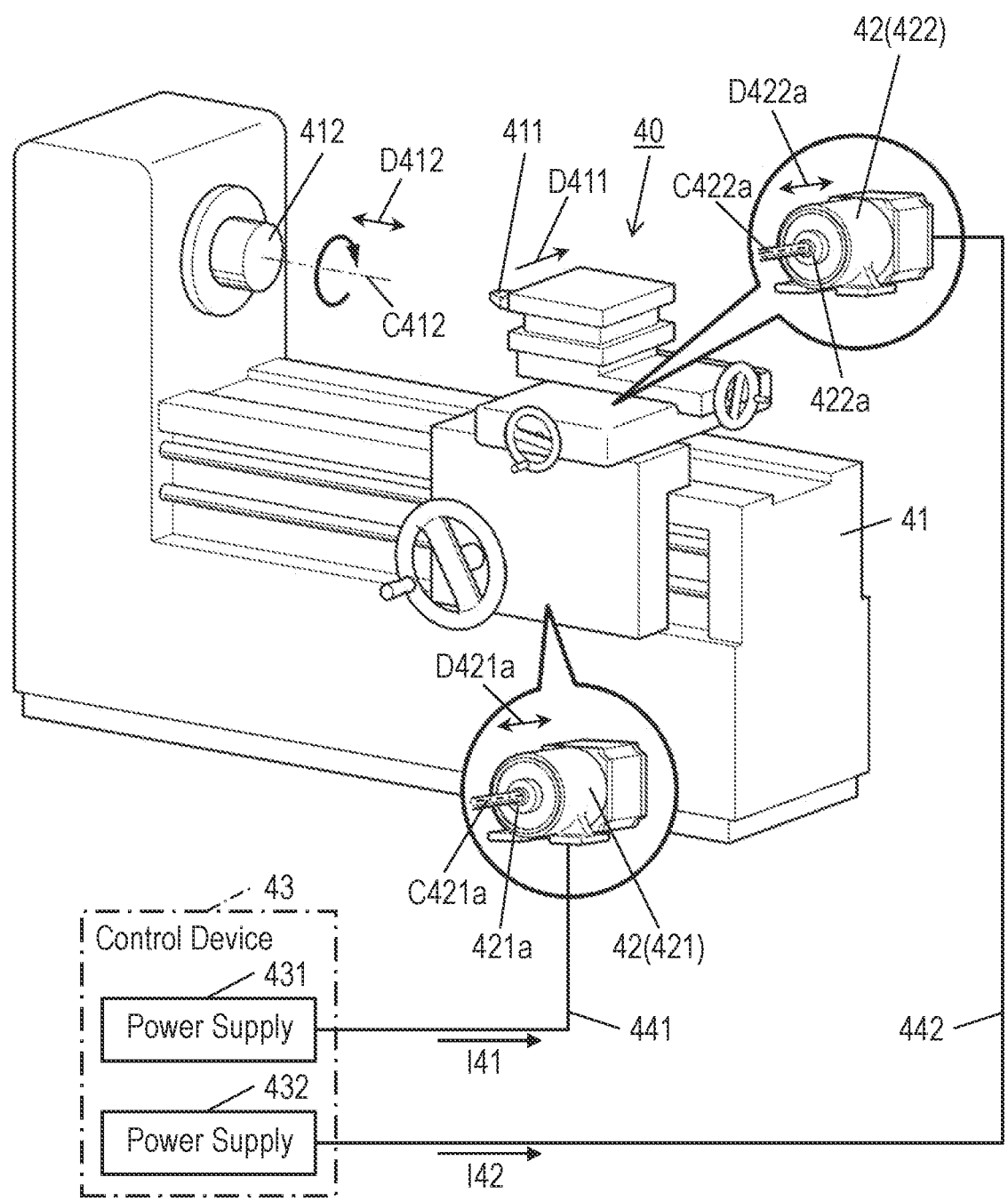
FIG. 2 is a diagram of an apparatus to be diagnosed by the diagnosis system.

FIG. 2 illustrates apparatus 40 as an example of apparatus 30. Apparatus 40 has a function as a lathe. Apparatus 40 may have a function as a machining center. Apparatus 40 includes mechanism unit 41, driver device 42, and controller 43.

Mechanism unit 41 executes a predetermined work. The predetermined work is the machining of workpiece 412 by rotating one of cutting tool 411 and workpiece 412 with respect to another. That is, apparatus 40 executes machining on workpiece 412 to obtain a member having a desired shape. Mechanism unit 41 executes machining on workpiece 412 by rotating workpiece 412 about rotation axis C412 with respect to cutting tool 411. That is, apparatus 40 has a function as a lathe. Cutting tool 411 executes machining on workpiece 412. Cutting tool 411 is replaceable. Workpiece 412 is, for example, a metal body.

Driver device 42 drives mechanism unit 41. In other words, driver device 42 is a driving source for mechanism unit 41. Driver device 42 includes plural motors 421 and 422. Motors 421 and 422 provide outputs changing depending on currents applied thereto.

Motor 421 is used to hold cutting tool 411 at a predetermined position with respect to workpiece 412 in a direction along rotation axis C412 of workpiece 412. That is, motor 421 of driver device 42 is configured to press one of cutting tool 411 and workpiece 412 against the other in direction D412 along rotation axis C412 of the one of cutting tool 411 and workpiece 412 with respect to the other. In accordance with the embodiment, direction D421a of rotation axis C421a of rotor 421a of motor 421 is direction D412 along rotation axis C412 of one of cutting tool 411 and workpiece 412 with respect to the other, but is not limited thereto.

Motor 422 is a so-called feed motor. Motor 422 moves cutting tool 411 in a machining direction. That is, motor 422 generates a force (feed component) in cutting tool 411 in a direction opposite to feed direction D411 of cutting tool 411 to workpiece 412. In the present exemplary embodiment, direction D422a of rotation axis C422a of rotor 422a of motor 422 is feed direction D411 of one of cutting tool 411 and workpiece 412 with respect to the other, but is not limited thereto.

Motors 421 and 422 are alternating current (AC) motors that operate with an AC current. Each AC motor may be a three-phase AC motor or a single-phase AC motor. Each of motors 421 and 422 provides an output (the number of rotations per unit time) that changes depending on a change in a reference frequency of the AC current supplied thereto. For example, as the reference frequency increase, the output increases (an output shaft of the motor rotates fast). As the reference frequency is low, the output decreases (the output shaft rotates slowly).

Controller 43 is configured to control driver device 42. Controller 43 includes power supplies 431 and 432. Power supplies 431 and 432 supply currents I41 and I42 to motors 421 and 422 of driver device 42, respectively. In particular, power supplies 431 and 432 supply currents I41 and I42 to motors 421 and 422 of driver device 42, respectively, in order for mechanism unit 41 to execute a predetermined work. That is, currents I41 and I42 are supplied to driver device 42 while the predetermined work is executed by apparatus 40. Power supplies 431 and 432 are connected to motors 421 and 422 via electric wires 441 and 442, respectively. In accordance with the embodiment, since motors 421 and 422 are AC motors, currents I41 and I42 are AC currents having a reference frequency. Power supplies 431 and 432 have a function of adjusting the reference frequencies of currents I41 and I42. Power supplies 431 and 432 may be implemented by known AC power supply circuits, and detailed description thereof will be omitted.

1.2.2 Diagnosis System

Diagnosis system 10 determines the condition of cutting tool 411 as the condition of apparatus 40. The condition of cutting tool 411 is roughly classified into two categories depending on whether the tool has a damage or not. In a case where cutting tool 411 is not damaged, diagnosis system 10 determines that the condition of apparatus 40 is normal. Examples of the damage to cutting tool 411 are flank wear, crater wear, chipping, defects, plastic deformation, built edge (welding), thermal crack, boundary wear, and flaking. The wear of cutting tool 411 occurs in the same manner so long as the same apparatus 40 is used. However, the defects of cutting tool 411 and signs thereof are hardly determined because it is on a case-by-case basis even though the same apparatus 40 is used. That is, the damage of cutting tool 411 includes a damage that is easily identified and a damage that is hardly identified. In a case where cutting tool 411 has a damage that is easily identified, diagnosis system 10 determines that the condition of apparatus 40 is abnormal. On the other hand, in a case where cutting tool 411 has a damage hardly that is hardly identified, diagnosis system 10 determines that the condition of apparatus 40 is an unspecified condition. That is, the abnormality referred to in accordance with the embodiment may be a known abnormality caused by the damage that is easily identified by diagnosis system 10. The unspecified condition may refer to an unknown abnormality caused by the damage that is hardly identified by diagnosis system 10. The unknown abnormality also includes signs of the defect.

As illustrated in FIG. 1, diagnosis system 10 includes measurement unit 20. Diagnosis system 10 further includes acquisition unit 11, extraction unit 12, determination unit 13, output unit 14, collection unit 15, generation unit 16, and storage unit 17.

Measurement unit 20 measures current I30 supplied to driver device 31 of apparatus 30 and outputs waveform data (current waveform data) indicating a waveform related to current I30. Measurement unit 20 is attached to electric wire 32 through which current I30 flows from power supply 33 to driver device 31. Measurement unit 20 includes a current sensor. In accordance with the embodiment, measurement unit 20 includes a differential type current sensor. Thus, the waveform data is data indicating a waveform of a differential of current I30. The differential type current sensor may include a search coil. This differential type current sensor allows measurement unit 20 to be post-installed to electric wire 32 of completed apparatus 30.

In a case where the condition of cutting tool 411 is not normal, cutting tool 411 may have shearing, peeling, or cracking, upon machining workpiece 412. In this case, a force in direction D412 along rotation axis C412 of workpiece 412 may be applied to driver device 42. Such a force in a direction in which workpiece 412 is pushed with a tool (cutting tool 411) is also referred to as a back component. A force opposite to a machining direction, that is, feed direction D411 being a movement direction in which cutting tool 411 moves toward workpiece 412 is also referred to as a feed component.

In driver device 42, a force in the direction along rotation axis C412 of workpiece 412 is applied to rotor 421a of motor 421 holding cutting tool 411 at a predetermined position with respect to workpiece 412 in direction D412 along rotation axis C412 of workpiece 412. Such a force is applied to rotor 421a of motor 421 in driver device 42 while the predetermined work is executed by apparatus 40. Such a force may influence the change in the angular velocity of rotor 421a. The change in the angular velocity of rotor 421a may be reflected in current I41 supplied to motor 421. In a case where a force is applied in the direction along rotation axis C412 of workpiece 412 and cutting tool 411 is shifted from the predetermined position, controller 43 controls cutting tool 411 so as to move cutting tool 411 back to the predetermined position. Thus, the change in the current which is caused by such control may appear in current I41 supplied to motor 421.

That is, the change caused by the component of the force applied to driver device 42 (rotor 421a of motor 421) in a specific direction (direction D412 along rotation axis C412 of one of cutting tool 411 and workpiece 412 with respect to the other) may appear in current I41 supplied to driver device 42 (rotor 421a of motor 421). In particular, current I41 is supplied to driver device 42 (rotor 421a of motor 421) while the predetermined work is executed by apparatus 40. Measurement unit 20 measures current I41 supplied to driver device 42 of apparatus 40 and outputs waveform data (current waveform data) indicating a waveform related to current I41. For example, measurement unit 20 is attached to electric wire 441 through which current I41 flows from the power supply 431 to motor 421 of driver device 42. The waveform data indicates a waveform of a differential of current I41.

As described above, in diagnosis system 10, measurement unit 20 is not necessarily installed near driver device 42 (rotor 421a of motor 421). As long as measurement unit 20 can measure the current supplied to motor 421, measurement unit 20 may be installed in, e.g. a control panel that accommodates controller 43. Thus, mechanism unit 41 does not require a device for installing measurement unit 20, wiring routing, and a balance adjustment due to the installation of measurement unit 20. Therefore, when measurement unit 20 is installed, it is not necessary to take measures (for example, oil resistance measures, heat resistance measures, and water resistance measures) so that measurement unit 20 can be used in an environment of machining of workpiece 412. This configuration reduces a maintenance burden of measurement unit 20. In addition, it is possible to acquire the waveform data even during a work of apparatus 40. Therefore, it is not necessary to interrupt the work of apparatus 40 for the diagnosis of diagnosis system 10. Accordingly, the lengthening of the machining cycle due to the diagnosis may be reduced. Since the waveform data can be acquired even during the work of apparatus 40, it is possible to recognize the condition of cutting tool 411 (for example, the degree of wear of cutting tool 411) at any time, and to use cutting tool 411 up to a usable condition. Since it is possible to detect the unspecified condition which is different from the normal condition and the abnormal condition, it is possible to reduce a problem (for example, production of defective articles) that may occur when cutting tool 411 is in the unspecified condition. That is, diagnosis system 10 allows condition-based maintenance (CBM) to be applied instead of conventional time-based maintenance (TBM), as the maintenance of apparatus 40.

Acquisition unit 11 acquires waveform data (current waveform data) indicating a waveform related to current I30 supplied to driver device 31 of apparatus 30. Acquisition unit 11 is connected to measurement unit 20 and acquires the waveform data from measurement unit 20. The waveform data from measurement unit 20 indicates a waveform of a differential of current I30.

Acquisition unit 11 acquires waveform data (current waveform data) indicating a waveform related to current I41 to be supplied to driver device 42 of apparatus 40.

Extraction unit 12 acquires, from the waveform data acquired by acquisition unit 11, information to be used by determination unit 13. The information used by determination unit 13 is information regarding a change caused by the component of the force in a specific direction applied to the driver device. Extraction unit 12 converts the waveform indicated by the waveform data acquired by acquisition unit 11 into a frequency-axis waveform (see FIGS. 3 and 4). Extraction unit 12 extracts a target portion of the frequency-axis waveform obtained by the conversion that may include the change caused by the component of the force in a specific direction applied to driver device 31.

Figure 3:
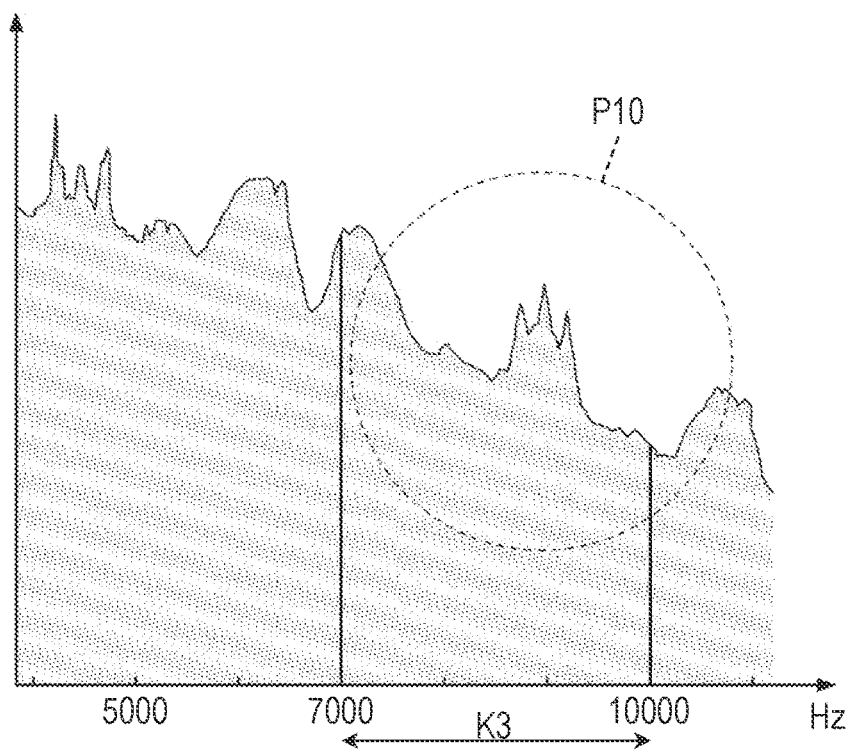
FIG. 3 illustrates a waveform relating to a current supplied to a driver device of the apparatus.
Figure 4:
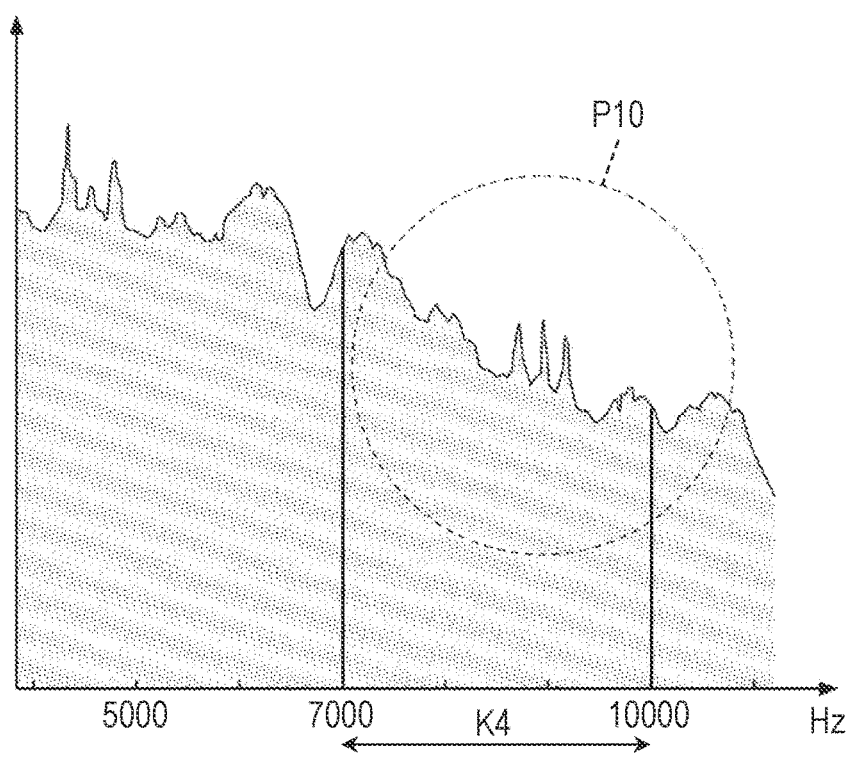
FIG. 4 illustrates a waveform relating to a current to the driver device of the apparatus.

FIGS. 3 and 4 illustrate frequency-axis waveforms obtained from waveform data (current waveform data) indicating waveforms related to current I41 to be supplied to driver device 42 of apparatus 40. In FIGS. 3 and 4, a horizontal axis represents frequencies, and a vertical axis represents the magnitude of the current component at the corresponding frequency. FIG. 3 illustrates the current in a case where cutting tool 411 is normal. FIG. 4 illustrates the current in a case where a defect is generated in cutting tool 411. Change P10 is observed in FIGS. 3 and 4. It is considered that change P10 is caused by a force applied to rotor 421a of motor 421 of driver device 42 in direction D412 along rotation axis C412 of one of cutting tool 411 and workpiece 412 with respect to the other. Thus, extraction unit 12 extracts, from the frequency-axis waveform, a target portion that may include a change caused by the back component applied to driver device 42. In FIGS. 3 and 4, extraction unit 12 extracts, from the frequency-axis waveform, the frequency range from 7 kHz to 10 kHz in which change P10 appears as target portions K3 and K4, respectively.

Determination unit 13 determines the condition of apparatus 30 based on the change caused by the component of the force in the specific direction applied to driver device 31. In accordance with the embodiment, determination unit 13 determines the condition of apparatus 30 based on target portions K3 and K4 extracted by extraction unit 12. The condition of apparatus 40 includes a normal condition, an abnormal condition, and an unspecified condition that is neither normal nor abnormal. That is, determination unit 13 determines whether the condition of apparatus 40 is normal, abnormal, or unspecified.

Determination unit 13 determines the condition of apparatus 40 based on target portions K3 and K4 with learned models M11 and M12. Learned model M11 is designed to output an unknownness value (a degree of unknownness) for target portions K3 and K4 input thereto. Determination unit 13 applies target portions K3 and K4 obtained from extraction unit 12 to learned model M11, and determines whether or not the condition of apparatus 40 is an unspecified condition based on an unknownness value obtained from learned model M11 by such application. For example, when the unknownness value is equal to or greater than a threshold value, determination unit 13 determines that the condition of apparatus 40 is an unspecified condition. When the unknownness value is smaller than the threshold value, determination unit 13 determines that the condition of apparatus 40 is not in the unspecified condition. Learned model M11 can be generated by unsupervised learning using target portions K3 and K4 in a case where apparatus 40 is normal or abnormal, as learning data (training samples). Learned model M12 is designed to output an abnormality value (a degree of abnormality) for the given inputs (target portions K3 and K4). Determination unit 13 applies the target portions obtained from extraction unit 12 to learned model M12, and determines whether or not the condition of apparatus 40 is a normal condition or an abnormal condition based on a value (abnormality value) obtained from learned model M12 by such application. For example, if the abnormality value is equal to or greater than the threshold value, determination unit 13 determines that the condition of apparatus 40 is abnormal. When the abnormality value is smaller than a threshold value, determination unit 13 determines that the condition of apparatus 40 is normal. Such learned model M12 can be generated by supervised learning using learning data (data set) for defining the relationship between a label corresponding to the abnormality value and the target portion. Learned models M11 and M12 are stored in storage unit 17. Storage unit 17 may store a set of learned models M11 and M12 for each type of cutting tool 411. That is, storage unit 17 may store plural sets of learned models M11 and M12.

Output unit 14 outputs the result of the determination by determination unit 13. Output unit 14 includes, for example, an audio output device and a display. The display is, for example, a thin display device, such as a liquid crystal display or an organic EL display. Output unit 14 may display the result of the determination by determination unit 13 on the display or report the result with the audio output device. Output unit 14 may transmit the result of the determination by determination unit 13 to an external device as data or may accumulate the result of the determination as the data. Output unit 14 does not necessarily include both the audio output device and the display. Output unit 14 may also output the result of the determination by determination unit 13 by, e.g. e-mail.

Collection unit 15 collects and accumulates the data acquired by acquisition unit 11. In the present exemplary embodiment, the data acquired by acquisition unit 11 includes the waveform data from measurement unit 20. The data collected by collection unit 15 is used to generate and update learned models M11 and M12.

Generation unit 16 generates learned models M11 and M12 used by determination unit 13. Generation unit 16 generates learned models M11 and M12 by a machine learning algorithm using a predetermined amount or more of learning data. The learning data may be previously prepared, or may be generated from the data accumulated by collection unit 15. The learning data generated from the data accumulated by collection unit 15 further improves the accuracy of the condition determination using learned models M11 and M12. In particular, in a case where it may be determined to be normal or abnormal even though it is determined to be an unspecified condition, additional learning is executed for the unspecified condition that may be considered as being normal or abnormal. Thus, improvement of the accuracy of the determination of being normal or abnormal is achieved. Generation unit 16 evaluates the newly generated learned models M11 and M12. When the evaluation of learned models M11 and M12 is improved, the generation unit updates learned models M11 and M12 by replacing learned models M11 and M12 stored in storage unit 17 with the newly generated learned models M11 and M12. As a method of generating learned models M11 and M12, as described above, unsupervised learning and supervised learning can be appropriately used in accordance with the details of the condition. As the unsupervised learning, typical dimensional compression methods, such as principal component analysis, self-organizing map, and autoencoder can be used. As the supervised learning, a typical multi-layer neural network having a supervised learning mechanism can be used.

In diagnosis system 10, acquisition unit 11, extraction unit 12, determination unit 13, output unit 14, collection unit 15, and generation unit 16 may be implemented by, for example, a computer system including one or more processors 10a (for example, microprocessors) and one or more memories. That is, one or more processors execute one or more programs stored in one or more memories to function as acquisition unit 11, extraction unit 12, determination unit 13, output unit 14, collection unit 15, and generation unit 16. The programs may be previously recorded in the memory, may be provided through a telecommunication line, such as the Internet, or may be recorded and provided on non-transitory recording medium 10b, such as a memory card.

1.3 Operation

Figure 5:
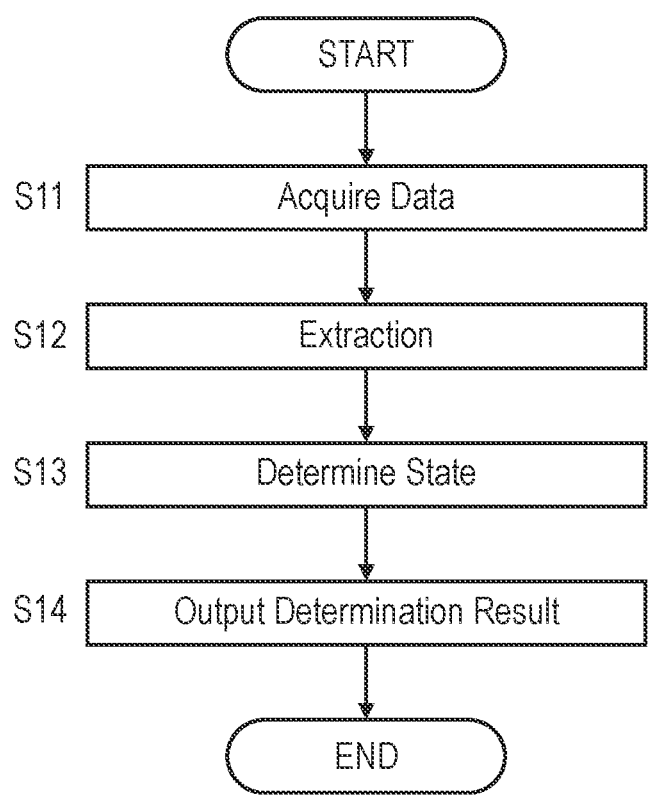
FIG. 5 is a flowchart illustrating an operation of the diagnosis system.

A basic operation of diagnosis system 10 will be briefly described below. In order to simplify the description, the diagnosis regarding mechanism unit 41 of apparatus 40 will be described. FIG. 5 is a flowchart illustrating the operation of diagnosis system 10.

In diagnosis system 10, acquisition unit 11 acquires waveform data (current waveform data) indicating a waveform relating to current I41 supplied to motor 421 of driver device 42 of apparatus 40 (Step S11). Then, in diagnosis system 10, extraction unit 12 converts the waveform indicated by the waveform data acquired by acquisition unit 11 into a frequency-axis waveform, and extracts a portion of the frequency-axis waveform including a change caused by a component of the force in the specific direction applied to driver device 42 (rotor 421a) (Step S12). That is, extraction unit 12 obtains the change from the extracted portion. Then, in diagnosis system 10, determination unit 13 determines the condition of apparatus 40 from the portion extracted by extraction unit 12 by using plural learned models M11 and M12 (Step S13). Finally, in diagnosis system 10, output unit 14 outputs the result of the determination by determination unit 13 (Step S14). As described above, diagnosis system 10 diagnoses mechanism unit 41 driven by driver device 42 based on the waveform data indicating the waveform related to current I41 supplied to driver device 42, and provides the result.

1.4 Examples

1.4.1 Example 1

Figure 6:
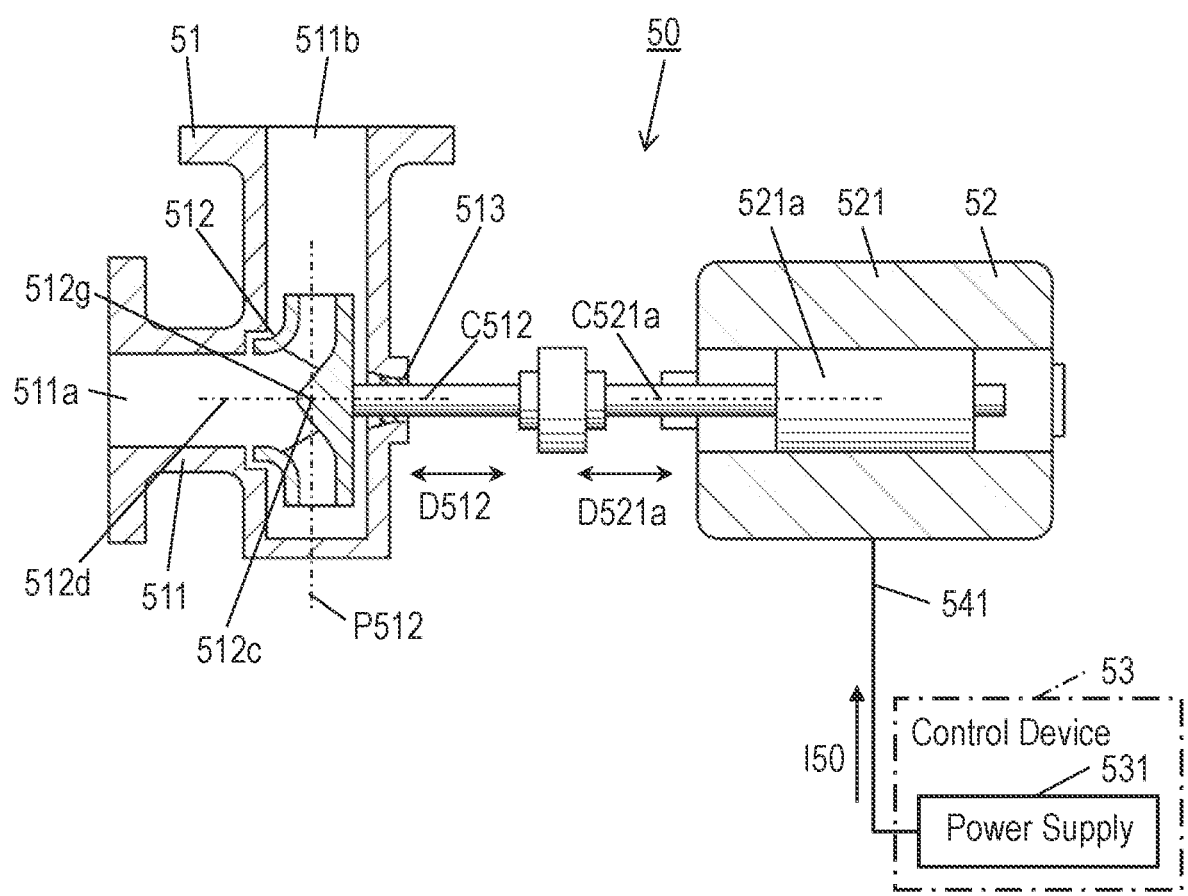
FIG. 6 is a diagram of another apparatus to be diagnosed by the diagnosis system.

FIG. 6 is a diagram of apparatus 50 as an example of apparatus 30 illustrated in FIG. 1. Diagnosis system 10 may be applied to apparatus 50 illustrated in FIG. 6. For each of acquisition unit 11, extraction unit 12, determination unit 13, output unit 14, collection unit 15, generation unit 16, and storage unit 17, the above description of apparatus 40 will be used by replacing apparatus 40 and the related elements, such as driver device 42, with apparatus 50 and the related elements, such as driver device 52.

Apparatus 50 is a pump. Fluid transported by apparatus 50 is not particularly limited, but is gas as an example. That is, apparatus 50 may be a vacuum pump. The vacuum pump is used in various fields, such as manufacturing of semiconductor devices. Apparatus 50 includes mechanism unit 51, driver device 52, and controller 53.

Mechanism unit 51 executes a predetermined work. The predetermined work is a transporting of the fluid by rotating impeller 512. Mechanism unit 51 includes tubular body 511 constituting a flow path, impeller 512 disposed in tubular body 511, and bearing 513 of impeller 512. The rotation of impeller 512 about rotation axis C512 causes the fluid to be drawn into tubular body 511 from opening 511a of tubular body 511 and discharged from opening 511b.

Driver device 52 drives mechanism unit 51. In other words, driver device 52 is a driving source for driving mechanism unit 51. Driver device 52 includes motor 521. Motor 521 has an output that changes depending on current supplied thereto.

Motor 521 is a rotary motor. Motor 521 rotates impeller 512. That is, driver device 52 causes motor 521 to rotate impeller 512. In accordance with the embodiment, direction D521a of rotation axis C521a of rotor 521a of motor 521 is direction D512 along rotation axis C512 of impeller 512, but is not limited thereto.

Motor 521 is an AC motor that operates with an AC current. The AC motor may be a three-phase AC motor or a single-phase AC motor. Specifically, motor 521 has an output (the number of rotations per unit time) that changes depending on the change in a reference frequency of the AC current supplied to the motor. As an example, when the reference frequency increases, the output increases (an output shaft rotates fast). When the reference frequency is low, the output decreases (the output shaft rotates slowly).

Controller 53 is configured to control driver device 52. Controller 53 includes power supply 531. Power supply 531 supplies current I50 to motor 521 of driver device 52. In particular, power supply 531 supplies current I50 to motor 521 of driver device 52 in order to cause mechanism unit 51 to execute a predetermined work. That is, current I50 is supplied to driver device 52 while apparatus 50 executes the predetermined work. Power supply 531 is connected to motor 521 via electric wire 541. In accordance with the embodiment, since motor 521 is an AC motor, current I50 is an AC current having a reference frequency. Power supply 531 has a function of adjusting the reference frequency of current I50. Since power supply 531 may be implemented by a known AC power supply circuit, detailed description thereof will be omitted.

Diagnosis system 10 determines the condition of impeller 512 and degradation of bearing 513, as the condition of apparatus 50. The condition of impeller 512 is roughly classified into two categories depending on whether impeller 512 rotates correctly or not. In a case where impeller 512 rotates correctly, diagnosis system 10 determines that the condition of apparatus 50 is normal. Examples of cases where impeller 512 does not rotate correctly include an occurrence of imbalance and the defect of impeller 512. For example, the imbalance may occur when foreign matters adhere to impeller 512. In a case where the imbalance occurs, the center of gravity of impeller 512 may deviate from the rotation center 512c at which rotation axis C512 intersects with surface P512 perpendicular to rotation axis C512 of impeller 512. This may contribute to degradation of bearing 513 of impeller 512 and flaking. Such flaking of bearing 513 occurs in the same manner so long as same apparatus 50 is used. Thus, it is possible to output the degree of degradation with supervised learning. However, the defect of impeller 512 is hardly identified because it is on a case-by-case basis even though same apparatus 50 is used. When the imbalance occurs in impeller 512, diagnosis system 10 determines that the condition of apparatus 50 is abnormal. In a case where the condition of the device is neither normal nor abnormal, diagnosis system 10 determines the condition of apparatus 50 to be an unspecified condition. That is, the abnormality referred to in accordance with the embodiment may be a known abnormality caused by the damage that is easily identified by diagnosis system 10, and the unspecified condition may refer to an unknown abnormality caused by the damage that is hardly identified by diagnosis system 10.

In a case where the imbalance occurs in impeller 512, impeller 512 rotates in a condition where central axis 512d of impeller 512 intersects with rotation axis C512. Thus, a force is applied to impeller 512 in a direction intersecting with rotation axis C512. Such a force may be transmitted to driver device 52. That is, a force in the direction intersecting with rotation axis C512 of impeller 512 may be applied to driver device 52. In particular, in driver device 52, the force in the direction intersecting with rotation axis C512 of impeller 512 is applied to rotor 521a of motor 521 that rotates impeller 512. Such a force is applied to driver device 52 (rotor 521a of motor 521) while the predetermined work is executed by apparatus 50. Such a force may influence the change in the angular velocity of rotor 521a. The change in the angular velocity of rotor 521a may be reflected in current I50 to be supplied to motor 521.

That is, the change caused by the component of the force applied to driver device 52 (rotor 521a of motor 521), in the specific direction (here, the direction intersecting with the rotation axis of impeller 512), may occur in current I50 supplied to driver device 52 (rotor 521a of motor 521). In particular, current I50 is supplied to driver device 52 (rotor 521a of motor 521) while the predetermined work is executed by apparatus 50. Thus, measurement unit 20 measures current I50 supplied to driver device 52 of apparatus 50 and, outputs waveform data (current waveform data) indicating a waveform related to current I50. For example, measurement unit 20 is attached to electric wire 541 through which current I50 flows from power supply 531 to motor 521 of driver device 52. The waveform data indicates a waveform of a differential of current I50.

As described above, in diagnosis system 10, measurement unit 20 may not necessarily installed near driver device 52 (rotor 521a of motor 521). As long as measurement unit 20 measures the current supplied to motor 521, measurement unit 20 may be installed in, e.g. a control panel that accommodates controller 53 therein. Thus, mechanism unit 51 does not require a device that installs measurement unit 20 and wiring routing, and balance adjustment due to the installation of measurement unit 20. Therefore, when measurement unit 20 is installed, it is not necessary to take measures (for example, oil resistance measures, heat resistance measures, and water resistance measures) so that measurement unit 20 can be used in tubular body 511. Thus, it is possible to reduce the maintenance burden of measurement unit 20. In addition, it is possible to acquire the waveform data even during a work of apparatus 50. Therefore, it is not necessary to interrupt the work of apparatus 50 for the diagnosis of diagnosis system 10. Further, since it is possible to acquire the waveform data even during the work of apparatus 50, it is possible to recognize the condition of impeller 512 at any time. In particular, in a case where the imbalance of impeller 512 continues, the bearing of impeller 512 degrades or breaks, which may cause apparatus 50 to fail. Thus, diagnosis system 10 may detect a sign before apparatus 50 fails and to prevent apparatus 50 from failing. That is, diagnosis system 10 allows condition-based maintenance (CBM) instead of conventional time-based maintenance (TBM) to be applied to maintenance of apparatus 50.

1.4.2 Example 2

Figure 7:
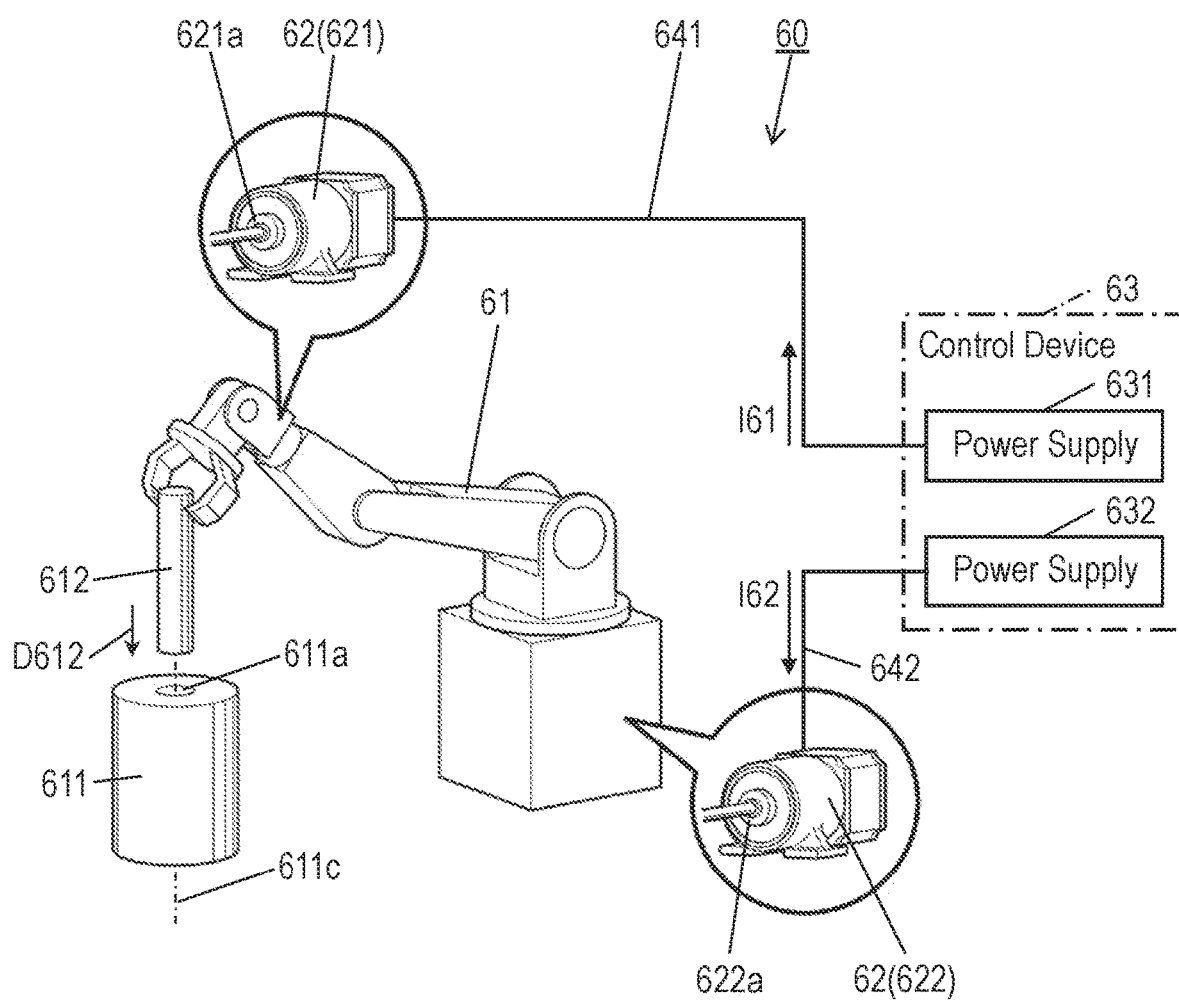
FIG. 7 is a diagram of still another apparatus to be diagnosed by the diagnosis system.

FIG. 7 is a diagram of apparatus 60 as an example of apparatus 30 illustrated in FIG. 1. Diagnosis system 10 may be applied to apparatus 60 illustrated in FIG. 7. For each of acquisition unit 11, extraction unit 12, determination unit 13, output unit 14, collection unit 15, generation unit 16, and storage unit 17, the above description of apparatus 40 will be used by replacing apparatus 40 and the related elements, such as driver device 42, with apparatus 60 and the related elements, such as driver device 62.

Apparatus 60 is a component mounting machine. In other words, apparatus 60 is a robot (robot arm) for mounting (assembling) a component. For example, apparatus 60 is an articulated robot. Apparatus 60 includes mechanism unit 61, driver device 62, and controller 63.

Mechanism unit 61 is configured to execute a predetermined work. The predetermined work is the attaching of component 612 to component 611. For example, component 611 has a cylindrical shape and component 612 has a circular columnar shape. Component 611 has circular hole 611$a$ provided therein. The work of attaching component 612 to component 611 is the inserting of component 612 into hole 611$a$ of component 611. Therefore, mechanism unit 61 has a function of holding component 612, and a function of transporting component 612. Mechanism unit 61 has a shape that imitates a hand and arm of a human.

Driver device 62 is configured to drive mechanism unit 61. In other words, driver device 62 is a driving source for driving mechanism unit 61. Driver device 62 includes motors 621 and 622. Motors 621 and 622 provide outputs that changes depending on currents supplied thereto. Motors 621 and 622 are, for example, rotary motors and linear motors, respectively. Motors 621 and 622 are AC motors that operate in alternating current. Each AC motor may be a three-phase AC motor or a single-phase AC motor. Motors 621 and 622 provide outputs (the number of rotations per unit time) that changes depending on the change in a reference frequency of the supplied AC current. For example, when the reference frequency increases, the output increases (an output shaft rotates fast). When the reference frequency is low, the output decreases (output the haft rotates slowly).

Motors 621 and 622 are used to cause component 612 to approach component 611 in predetermined direction D612. That is, driver device 62 is configured to cause component 612 to approach component 611 in predetermined direction D612 by motors 621 and 622. Predetermined direction D612 is a direction along central axis 611$c$ of component 611.

Controller 63 is configured to control driver device 62. Controller 63 includes power supplies 631 and 632. Power supplies 631 and 632 supply currents I61 and I62 to motors 621 and 622 of driver device 62, respectively. In particular, power supplies 631 and 632 supply currents I61 and I62 to motors 621 and 622 of driver device 62 in to allow mechanism unit 61 to execute a predetermined work. That is, currents I61 and I62 are supplied to driver device 62 while the predetermined work is executed by apparatus 60. Power supplies 631 and 632 are connected to motors 621 and 622 via electric wires 641 and 642, respectively. Since motors 621 and 622 are AC motors, currents I61 and I62 are AC currents having a reference frequency. Power supplies 631 and 632 have a function of adjusting the reference frequencies of currents I61 and I62. Since power supplies 631 and 632 may be known AC power supply circuits, detailed description thereof will be omitted.

Diagnosis system 10 determines the condition of the attaching of component 612 to component 611 as the condition of apparatus 60. The condition of the attaching is a condition of component 612 when component 612 is inserted into hole 611$a$ of component 611. When component 612 is correctly inserted into hole 611$a$ of component 611, diagnosis system 10 determines that the condition of apparatus 60 is normal. Examples of cases where component 612 is not correctly inserted into hole 611$a$ of component 611 include a forcible twisting and a damage of a component (component 611 and/or component 612). The forcible twisting means that component 612 is forcibly pushed into hole 611$a$ of component 611 while twisted. The Forcible twisting may occur when component 612 inclines or deviates from a reference position of component 612 with respect to component 611 due to a slight difference in intersection or handling. The forcible twisting may provide defective products. Even though the products are not defective, subtle cracks may be generated in component 611 and/or component 612, and contribute to damage component 611 and/or component 612. The forcible twisting occurs in the same manner so long as same apparatus 60 is used. However, the defect of the component is hardly identified because it is on a case-by-case basis even though same apparatus 60 is used. In a case where the forcible twisting occurs, diagnosis system 10 determines that the condition of apparatus 60 is abnormal. In a case where the condition of the device is neither normal nor abnormal, diagnosis system 10 determines the condition of apparatus 50 to be an unspecified condition. Thus, the abnormality referred to in accordance with the embodiment may be a known abnormality caused by the defect that is easily identified by diagnosis system 10. The unspecified condition may refer to an unknown abnormality caused by the defect that is hardly identified by diagnosis system 10.

In a case where the forcible twisting occurs, component 612 strongly contacts an inner surface of hole 611$a$ and an upper surface of component 611 in a direction along predetermined direction D612. This contacting applies a force to component 612 in predetermined direction D612. Such a force may be transmitted to driver device 62. That is, the force may be applied to driver device 62 in predetermined direction D612. In driver device 62, a force is applied to rotors 621$a$ and 622$a$ of motors 621 and 622 in predetermined direction D612. Such a force is applied to driver device 62 while the predetermined work is executed by apparatus 60. Such a force may influence the change in the angular velocities of rotors 621$a$ and 622$a$. The change in the angular velocities of rotors 621$a$ and 622$a$ may be reflected in currents I61 and I62 supplied to motors 621 and 622. In particular, such a force is likely to be applied to rotor 621$a$ of motor 621 close to component 612 of driver device 62.

That is, the change caused by the component of the force in the specific direction (here, predetermined direction D612) applied to driver device 62 (rotors 621$a$ and 622$a$ of motors 621 and 622) may occur in currents I61 and I62 supplied to driver device 62 (rotors 621$a$ and 622$a$ of motors 621 and 622). In particular, currents I61 and I62 are supplied to driver device 62 (rotor 621a of motor 621) while the predetermined work is executed by apparatus 60. Such a force is particularly likely to be applied to rotor 621a of motor 621 close to component 612 in driver device 62. Thus, measurement unit 20 measures current I61 supplied to driver device 62 of apparatus 60 and outputs waveform data (current waveform data) indicating a waveform related to current I61. For example, measurement unit 20 is attached to electric wire 641 through which current I61 flows from power supply 631 to motor 621 of driver device 62. The waveform data indicates a waveform of a differential of current I61.

As described above, in diagnosis system 10, measurement unit 20 is not necessarily installed near driver device 62 (rotor 621a of motor 621). As long as measurement unit 20 may measure the current supplied to motor 621, measurement unit 20 may be installed in, e.g. a control panel that accommodates controller 63. Thus, mechanism unit 61 does not require a device that installs measurement unit 20 and wiring routing, and there is no need for balance adjustment due to the installation of measurement unit 20. Therefore, when measurement unit 20 is installed, it is not necessary to take measures (for example, oil resistance measures, heat resistance measures, and water resistance measures) so that measurement unit 20 can be used. Thus, it is possible to reduce the maintenance burden of measurement unit 20. In addition, it is possible to acquire the waveform data even during a work of apparatus 60. Therefore, it is not necessary to interrupt the work of apparatus 60 for the diagnosis of diagnosis system 10. Further, since it is possible to acquire the waveform data even during the work of apparatus 60, it is possible to recognize the condition of the attaching of component 612 to component 611 at any time. Therefore, in a case where apparatus 60 is abnormal (that is, in a case where prying occurs), the determination result is fed back to controller 63, thereby immediately interrupting the work on apparatus 60. This reduces the need to decrease a speed at which component 612 is inserted into component 611 in order to reduce the occurrence of prying, and accordingly, increases the speed at which component 612 is inserted into component 611. This contributes to the improvement of productivity. Similarly, in a case where apparatus 60 is in the unspecified condition, the determination result is fed back to controller 63, thereby immediately interrupting the work on apparatus 60. That is, diagnosis system 10 allows condition-based maintenance (CBM) instead of conventional time-based maintenance (TBM) to be applied to the maintenance of apparatus 60.

1.4.3 Example 3

Figure 8:
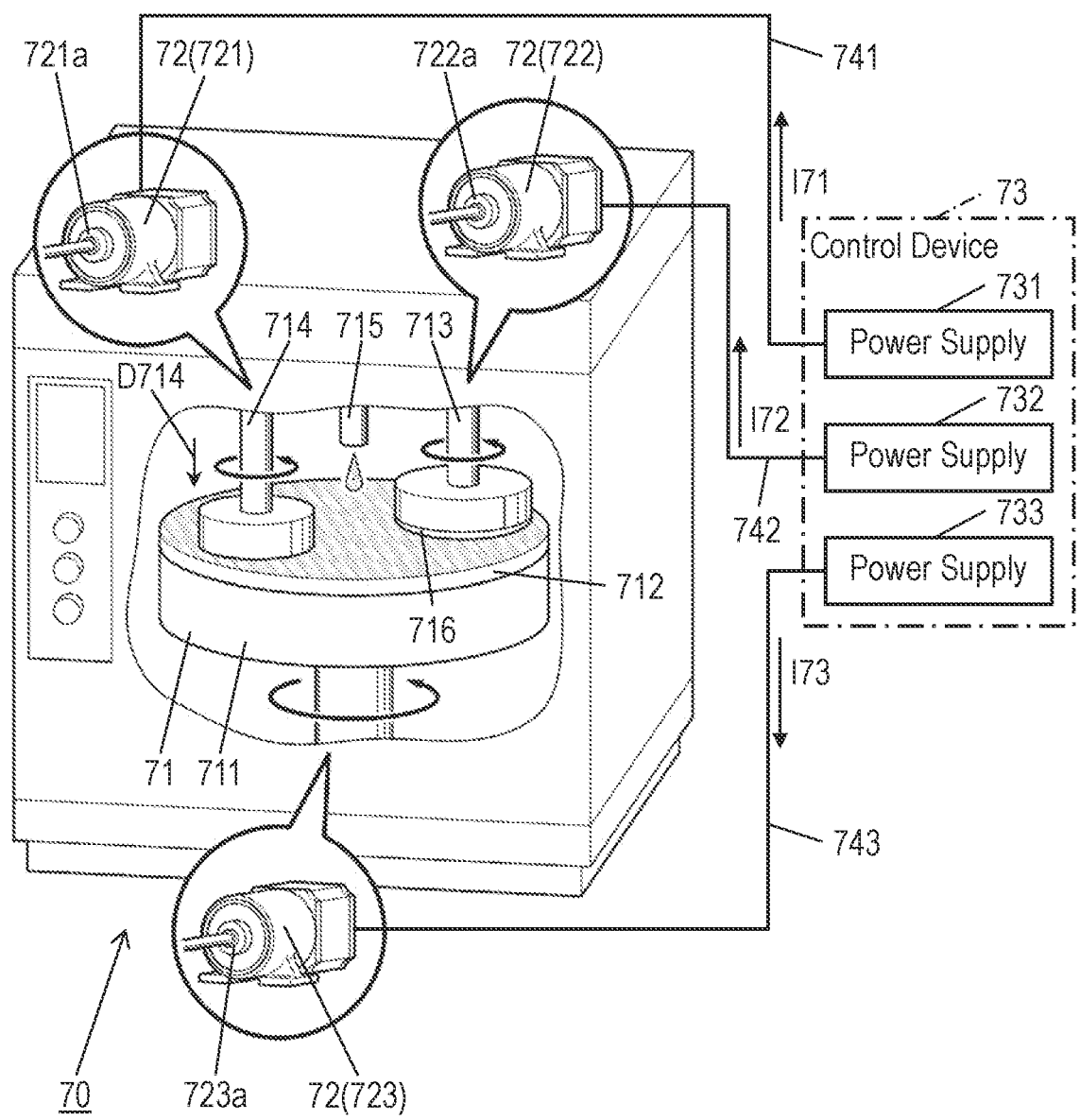
FIG. 8 is a diagram of a further apparatus to be diagnosed by the diagnosis system.

FIG. 8 is a diagram of apparatus 70 as an example of apparatus 30 illustrated in FIG. 1. Diagnosis system 10 may be applied to apparatus 70 illustrated in FIG. 8. For each of acquisition unit 11, extraction unit 12, determination unit 13, output unit 14, collection unit 15, generation unit 16, and storage unit 17, the above description of apparatus 40 will be used by replacing apparatus 40 and the related elements, such as driver device 42, with apparatus 70 and the related elements, such as driver device 72.

Apparatus 70 is a polishing device. In particular, apparatus 70 is a polishing device that executes chemical-mechanical polishing. Apparatus 70 includes mechanism unit 71, driver device 72, and controller 73.

Mechanism unit 71 is configured to execute a predetermined work. The predetermined work is a polishing of object 716 with polishing pad 712. Object 716 is, for example, a semiconductor substrate (semiconductor wafer) such as a silicon substrate. Mechanism unit 71 includes polishing plate 711, polishing pad 712, carrier 713, dresser 714, and slurry feeder 715. Polishing plate 711 holds polishing pad 712 configure to polish a surface of object 716. Carrier 713 holds object 716. Object 716 is held while the surface of object 716 contacts the surface of polishing pad 712. Dresser 714 is used to adjust the condition of the surface of polishing pad 712. In particular, dresser 714 is used to remove clogging and foreign matters on the surface of polishing pad 712, regenerate the surface of polishing pad 712, and restore the polishing rate. Slurry feeder 715 supplies the slurry onto the surface of polishing pad 712. The slurry assists mechanical polishing of object 716.

Driver device 72 is configured to drive mechanism unit 71. In other words, driver device 72 is a driving source for driving mechanism unit 71. Driver device 72 includes motors 721, 722, and 723. Motors 721, 722, and 723 have outputs that change depending on currents supplied thereto.

Motors 721, 722, and 723 are rotary motors having rotating rotors 721a, 722a, and 723a, respectively. Motor 721 rotates dresser 714. That is, driver device 72 causes motor 721 to rotate dresser 714. Motor 722 rotates carrier 713. That is, driver device 72 causes motor 722 to rotate carrier 713. As described above, driver device 72 is configured to rotate object 716 and dresser 714 by motors 721 and 722. Motor 723 rotates polishing plate 711. That is, driver device 72 causes motor 723 to rotate polishing plate 711.

Motors 721, 722, and 723 are AC motors that operate in alternating current. Each AC motor may be a three-phase AC motor or a single-phase AC motor. Motors 721, 722, and 723 have outputs (he number of rotations per unit time) that change depending on the change in a reference frequency of the AC current supplied to the motors. For example, when the reference frequency increases, the output increases (output shaft rotates fast). When the reference frequency is low, the output decreases (output shaft rotates slowly).

Controller 73 is configured to control driver device 72. Controller 73 includes power supplies 731, 732, and 733. Power supplies 731, 732, and 733 supply currents I71, I72, and I73 to motors 721, 722, and 723 of driver device 72, respectively. Power supplies 731, 732, and 733 supply currents I71, I72, and I73 to motors 721, 722, and 723 of driver device 72 in order to allow mechanism unit 71 to execute a predetermined work. That is, currents I71, I72, and I73 are supplied to driver device 72 while the predetermined work is executed by apparatus 70. Power supplies 731, 732, and 733 are connected to motors 721, 722, and 723 via electric wires 741, 742, and 743. Since motors 721, 722, and 723 are AC motors, currents I71, I72, and I73 are AC currents having reference frequencies. Power supplies 731, 732, and 733 have a function of adjusting the reference frequencies of currents I71, I72, and I73. Power supplies 731, 732, and 733 may be a known AC power supply circuit, and detailed description thereof will be omitted.

Diagnosis system 10 determines the conditions of polishing pad 712 and dresser 714, as the condition of apparatus 70. The condition of polishing pad 712 is roughly classified into two categories depending on whether the surface of polishing pad 712 is damaged or not. In a case where the surface of polishing pad 712 is not damaged, diagnosis system 10 determines that the condition of apparatus 70 is normal. Examples of the damage to the surface of polishing pad 712 include wear and defects. The wear of the surface of polishing pad 712 occurs in the same manner so long as same apparatus 70 is used. However, the defect of the surface of polishing pad 712 is hardly identified because it is on a case-by-case basis due to affinity of the slurry for polishing pad 712 even though same apparatus 70 is used. The affinity changes depending on the condition of dresser 714. That is, the damage of the surface of polishing pad 712 includes a damage that is easily identified and a damage that is hardly identified. In a case where polishing pad 712 has a damage that is easily identified, diagnosis system 10 determines that the condition of apparatus 70 is abnormal. On the other hand, in a case where polishing pad 712 has a damage that is hardly identified, diagnosis system 10 determines that the condition of apparatus 70 is in an unspecified condition. That is, the abnormality referred to in accordance with the embodiment may be a known abnormality caused by the damage that is easily identified by diagnosis system 10, and the unspecified condition may refer to an unknown abnormality caused by the damage that is hardly identified by diagnosis system 10.

In a case where the surface of polishing pad 712 is damaged in driver device 72, a force which is in direction D714 in which dresser 714 is pressed against polishing pad 712 and which is applied to rotor 721a of motor 721 may change. This force is applied to driver device 72 (rotor 721a of motor 721) while the predetermined work is executed by apparatus 70. This force may influence the change in the angular velocity of rotor 721a. The change in the angular velocity of rotor 721a may be reflected in current I71 supplied to motor 721.

That is, the change caused by the component of the force applied to driver device 72 (rotor 721a of motor 721) in the specific direction (here, direction D714 in which dresser 714 is pressed against polishing pad 712) may occur in current I71 supplied to driver device 72 (rotor 721a of motor 721). Current I71 is supplied to driver device 72 (rotor 721a of motor 721) while the predetermined work is executed by apparatus 70. Thus, measurement unit 20 measures current I71 supplied to driver device 72 of apparatus 70 and outputs waveform data (current waveform data) indicating a waveform related to current I171. For example, measurement unit 20 is attached to electric wire 741 through which current I71 flows from power supply 731 to motor 721 of driver device 72. The waveform data indicates a waveform of a differential of current I71.

In diagnosis system 10, measurement unit 20 is not necessarily installed near driver device 72 (rotor 721a of motor 721). As long as measurement unit 20 may measure the current supplied to motor 721, measurement unit 20 may be installed in, e.g. a control panel that accommodates controller 73. Thus, mechanism unit 71 does not require a device that installs measurement unit 20 and wiring routing, and there is no need for balance adjustment and the like due to the installation of measurement unit 20. Therefore, when measurement unit 20 is installed, it is not necessary to take measures (for example, oil resistance measures, heat resistance measures, and water resistance measures) so that measurement unit 20 can be used near polishing pad 712. Thus, it is possible to reduce the maintenance burden of measurement unit 20. In addition, it is possible to acquire the waveform data even during a work of apparatus 70. Therefore, it is not necessary to interrupt the work of apparatus 70 for the diagnosis of diagnosis system 10. Further, since it is possible to acquire the waveform data even during the work of apparatus 70, it is possible to recognize the condition of polishing pad 712 at any time. In particular, since it is possible to determine the degree of wear of polishing pad 712, it is possible to replace polishing pad 712 after the surface of polishing pad 712 is completely worn. That is, since polishing pad 712 is replaced in accordance with the actual wear condition, not in accordance with the usage time, it is possible to efficiently use polishing pad 712. That is, diagnosis system 10 allows condition-based maintenance (CBM) instead of conventional time-based maintenance (TBM) to be applied to maintenance of apparatus 70.

1.5 Summary

Diagnosis system 10 described above includes acquisition unit 11 and determination unit 13. Acquisition unit 11 acquires waveform data indicating a waveform related to current I30 supplied to driver device 31 of apparatus 30. Determination unit 13 determines the condition of apparatus 30 from the change caused by the component of the force in the specific direction applied to driver device 31. The change is obtained based on the waveform data. Diagnosis system 10 improves the accuracy of determining the condition of apparatus 30.

In other words, diagnosis system 10 executes a diagnosis method as follows. The diagnosis method includes an acquisition step and a determination step. The acquisition step is a step of acquiring waveform data indicating a waveform related to current I30 supplied to driver device 31 of apparatus 30. The determination step is a step of determining the condition of apparatus 30 based on the change caused by the component of the force in the specific direction applied to driver device 31. The change is obtained from the waveform data. This diagnosis method improves the accuracy of determining the condition of apparatus 30.

Diagnosis system 10 is implemented by a computer system including one or more processors. That is, diagnosis system 10 is implemented by one or more processors executing a program (diagnostic program). The program is a program (computer program) for causing one or more processors to execute the diagnosis method. This program improves the accuracy of determining the condition of apparatus 30 by the diagnosis method.

2. Modification Examples

The exemplary embodiments of the present disclosure are not limited to the above exemplary embodiment. The above embodiment may be variously changed depending on the design and the like as long as the object of the present disclosure can be achieved. Modification examples of the above exemplary embodiment are listed below.

Determination unit 13 determines the condition of apparatus 30 to be one of the normal condition, the abnormal condition, and the unspecified condition, but determination unit 13 is not limited to this. Determination unit 13 may determine respective degrees of the normal condition, the abnormal condition, and the unspecified condition. Thus, diagnosis system 10 can issue different notifications depending on the degrees of the normal condition, the abnormal condition, and the unspecified condition. For example, in a case where the degree of the normal condition is low, diagnosis system 10 may issue a notification that a possibility of being in an abnormal or unspecified condition is high. In a case where the degrees of the abnormal condition and the unspecified condition are greater than a threshold value, diagnosis system 10 may execute processing such as stopping of an operation of apparatus 30 and executing of a notification. Alternatively, the condition of apparatus 30 is not limited to three categories of the normal condition, the abnormal condition, and the unspecified condition, and may be four or more categories of conditions or two categories of conditions.

For example, diagnosis system 10 may not necessarily include measurement unit 20. For example, in a case where measurement unit 20 is previously provided in apparatus 30, diagnosis system 10 may include only acquisition unit 11, extraction unit 12, determination unit 13, output unit 14, collection unit 15, generation unit 16, and storage unit 17.

Measurement unit 20 may not necessarily include a differential type current sensor, and may be another known current sensor.

Diagnosis system 10 may not necessarily include collection unit 15, generation unit 16, and storage unit 17. That is, diagnosis system 10 may not have a function of updating learned models M11, M12, . . . by itself. Storage unit 17 does not necessarily store plural learned models M11, M12, and the like.

Diagnosis system 10 may not necessarily include extraction unit 12. For example, in a case where a user executes a processing in extraction unit 12 instead, diagnosis system 10 may not extract the portion including change P10 caused by the component of the force in the specific direction applied to driver device 31. Further, the condition of apparatus 30 may be output from learned models M11 and M12 in response to an input of the entirety of the waveform indicated by the waveform data acquired by acquisition unit 11. That is, the extraction of the portion including change P10 may be omitted.

Diagnosis system 10 may not necessarily include output unit 14. For example, diagnosis system 10 may output the condition of apparatus 30 determined by determination unit 13 to the outside of diagnosis system 10.

Diagnosis system 10 may be implemented by plural computers, and the functions (particularly, acquisition unit 11, extraction unit 12, determination unit 13, output unit 14, collection unit 15, and generation unit 16) of diagnosis system 10 may be divided into plural devices. For example, acquisition unit 11, extraction unit 12, determination unit 13, and output unit 14 may be provided in a personal computer installed in a facility including the device, and generation unit 16 and output unit 14 may be provided in an external server or the like. In this case, diagnosis system 10 is implemented by the combination of the personal computer and the server. At least some of the functions of diagnosis system 10 may be realized by, for example, a cloud (cloud computing).

An executing subject of diagnosis system 10 described above includes a computer system. The computer system includes a processor and a memory as hardware. When the processor executes a program recorded in the memory of the computer system, the function as the executing subject of diagnosis system 10 in the present disclosure is realized. The program may be previously recorded in the memory of the computer system or may be provided via a telecommunication line. The program may be recorded and provided on a non-transitory recording medium, such as a memory card, an optical disk, or a hard disk drive, readable by the computer system. The processor in the computer system is composed of one or more electronic circuits including a semiconductor integrated circuit (IC) or a large scale integrated circuit (LSI). The circuit is referred to as an IC or an LSI, but the name changes depending on the degree of integration, and it may be referred to as a system LSI, a very large scale integration (VLSI), or an ultra large scale integration (ULSI). A field programmable gate array (FGPA) that is programmed after an LSI is manufactured, or a reconfigurable logical device that can reconfigure the junction relationships in the LSI or set up circuit partitions in the LSI can also be used for the same purpose. Plural electronic circuits may be integrated on one chip, or may be divided into plural chips. The chips may be integrated in one device, or may be distributed in plural devices.

3. Aspect

As apparent from the above exemplary embodiment and the modification examples, the present disclosure includes the following aspects. In the following, reference marks are given in parentheses only to clearly indicate the correspondence with the exemplary embodiment.

In a first aspect, a diagnosis system (10) includes an acquisition unit (11) and a determination unit (13). The acquisition unit (11) acquires waveform data indicating a waveform related to a current (I30, I41, I42, I50, I61, I62, I71, I72, or I73) supplied to a driver device (31, 42, 52, 62, or 72) of a device (30, 40, 50, 60, or 70). The determination unit (13) determines the condition of the device (30, 40, 50, 60, or 70) based on a change caused by a component of a force in a specific direction applied to driver device 31. The change is obtained from the waveform data. According to this aspect, it is possible to improve the accuracy of determining the condition of the device (30, 40, 50, 60, or 70).

A second aspect is based on the diagnosis system (10) of the first aspect. In the second aspect, the device (30, 40, 50, 60, or 70) is a work device configured to execute a predetermined work. The current (I30, I41, I42, I50, I61, I62, I71, I72, or I73) is supplied to the driver device (31) while the predetermined work is executed by the device (30). The force is applied to the driver device (31) while the predetermined work is executed by the device (30, 40, 50, 60, or 70). According to this aspect, it is possible to determine the condition of the device (30, 40, 50, 60, or 70) without interrupting the work on the device (30).

A third aspect is based on the diagnosis system (10) of the second aspect. In the third aspect, the driver device (42, 52, 62, or 72) includes a motor (421, 422, 521, 621, 622, 721, 722, or 723). A force applied to the driver device (31, 42, 52, 62, or 72) is a force applied to a rotor (421a, 422a, 521a, 621a, 622a, 721a, 722a, or 723a) of the motor (421, 422, 521, 621, 622, 721, 722, or 723). According to this aspect, it is possible to further improve the accuracy of determining the condition of the device (40, 50, 60, or 70).

A fourth aspect is based on the diagnosis system (10) of the third aspect. In the fourth aspect, the predetermined work is a work of executing machining on a workpiece (412) by rotating one of a cutting tool (411) and the workpiece (412) with respect to another. The driver device (42) is configured to press one of the cutting tool (411) and the workpiece (412) in a direction along the rotation axis of the above rotation against the other by the motor (421). The specific direction is along the rotation axis. According to this aspect, it is possible to further improve the accuracy of determining the condition of the device (40).

A fifth aspect is based on the diagnosis system (10) of the third aspect. In the fifth aspect, the predetermined work is a work of transporting fluid by rotating an impeller (512). The driver device (52) is configured to rotate the impeller (512) by the motor (521). The specific direction intersects with the rotation axis of the impeller (512). According to this aspect, it is possible to improve the accuracy of determining the condition of the device (50).

A sixth aspect is based on the diagnosis system (10) of the third aspect. In the sixth aspect, the predetermined work is a work of attaching a second component (612) to a first component (611). The driver device (62) is configured to cause the second component (612) to approach the first component (611) in a predetermined direction by the motor (621 and 622). The specific direction is the predetermined direction. According to this aspect, it is possible to further improve the accuracy of determining the condition of the device (60).

A seventh aspect is based on the diagnosis system (10) of the third aspect. In the seventh aspect, the predetermined work is a work of polishing an object (716) with a polishing pad (712). The driver device (72) is configured to press a dresser (714) against the polishing pad (712) by the motor (721). The specific direction is a direction in which the dresser (714) is pressed against the polishing pad (712). According to this aspect, it is possible to further improve the accuracy of determining the condition of the device (70).

An eighth aspect is based on the diagnosis system (10) of any one of the first to seventh aspects. In the eighth aspect, the condition of the device (30, 40, 50, 60, or 70) includes a normal condition, an abnormal condition, and an unspecified condition that is neither the normal condition nor the abnormal condition. According to this aspect, even though the condition of the device (30, 40, 50, 60, or 70) is unknown to the diagnosis system (10), it is possible to detect the condition as the unspecified condition, and thus to attract attentions to a manager of the device (30, 40, 50, 60, or 70).

A ninth aspect is based on the diagnosis system (10) of the eighth aspect. In the ninth aspect, in a case where the condition is not the unspecified condition, the determination unit (13) determines whether the device (30, 40, 50, 60, or 70) is normal or abnormal. According to this aspect, it is possible to further improve the accuracy of determining the condition of the device (30, 40, 50, 60, or 70).

A tenth aspect is based on the diagnosis system (10) of any one of the first to ninth aspects. In the tenth aspect, the diagnosis system (10) further includes an extraction unit (12) configured to convert the waveform into a frequency-axis waveform and extracts a portion of from the frequency-axis waveform that may include the change. The determination unit (13) determines the condition of the device (30, 40, 50, 60, or 70) based on the portion extracted by the extraction unit (12). According to this aspect, it is possible to further improve the accuracy of determining the condition of the device (30, 40, 50, 60, or 70).

An eleventh aspect is based on the diagnosis system (10) of the tenth aspect. In the eleventh aspect, the determination unit (13) determines the condition of the device (30, 40, 50, 60, or 70) based on the portion by using the learned model (M11 and M12). According to this aspect, it is possible to further improve the accuracy of determining the condition of the device (30, 40, 50, 60, or 70).

A twelfth aspect is based on the diagnosis system (10) of any one of the first to eleventh aspects. In the twelfth aspect, the diagnosis system (10) further includes a measurement unit (20) configured to measure the current (I30, I41, I42, I50, I61, I62, I71, I72, or I73) and outputs the waveform data. The measurement unit (20) includes a differential type current sensor. According to this aspect, it is possible to improve the accuracy of determining the condition of the device (30, 40, 50, 60, or 70).

A thirteenth aspect is based on the diagnosis system (10) of the twelfth aspect. In the thirteenth aspect, the measurement unit (20) is attached to an electric wire (32, 441, 442, 541, 641, 642, 741, 742, or 743) through which the current (I30, I41, I42, I50, I61, I62, I71, I72, or I73) flows. According to this aspect, the diagnosis system (10) may be installed easily.

A fourteenth aspect is a diagnosis method that includes an acquisition step and a determination step. The acquisition step is a step of acquiring waveform data indicating a waveform related to a current (I30, I41, I42, I50, I61, I62, I71, I72, or I73) supplied to a driver device (31, 42, 52, 62, or 72) of a device (30, 40, 50, 60, or 70). The determination step is a step of determining the condition of the device (30, 40, 50, 60, or 70) based on a change caused by a component of a force in a specific direction applied to the driver device (31, 42, 52, 62, or 72). The change is obtained from the waveform data. According to this aspect, it is possible to improve the accuracy of determining the condition of the device (30, 40, 50, 60, or 70).

A fifteenth aspect is a program for allowing one or more processors to execute the diagnosis method of the fourteenth aspect. According to this aspect, it is possible to improve the accuracy of determining the condition of the device (30, 40, 50, 60, or 70).

REFERENCE MARKS IN THE DRAWINGS 10 diagnosis system
11 acquisition unit
12 extraction unit
13 determination unit
M11, M12 learned model
30 device
31 driver device
32 electric wire
I30 current
40 device
411 cutting tool
412 workpiece
42 driver device
421, 422 motor
421a, 422a rotor
441, 442 electric wire
I41, I42 current
50 device
512 impeller
513 bearing
52 driver device
521 motor
521a rotor
541 electric wire
I50 current
60 device
611 component (first component)
612 component (second component)
62 driver device
621, 622 motor
621a, 622a rotor
641, 642 electric wire
i61, i62 current
70 device
712 polishing pad
714 dresser
716 object
72 driver device
721, 722, 723 motor
721a, 722a, 723a rotor
741, 742, 743 electric wire
I71, I72, I73 current

The invention claimed is:
1. A diagnosis system configured to diagnose an apparatus including a driver device, the system comprising:
an acquisition unit configured to acquire waveform data indicating a waveform related to a current to be supplied to the driver device;

a determination unit configured to
obtain, based on the waveform data, a change caused by a component of a force in a particular direction applied to the driver device, and
determine a condition of the apparatus based on the obtained change; and
a measurement unit configured to measure the current and output the waveform data, wherein the measurement unit includes a differential type current sensor.

2. The diagnosis system of claim 1, wherein
the apparatus is a work device configured to execute a predetermined work,
the current is supplied to the driver device while the apparatus executes the predetermined work, and
the force is applied to the driver device while the apparatus executes the predetermined work.

3. The diagnosis system of claim 2, wherein
the driver device includes a motor including a rotor, and
the force applied to the driver device is applied to the rotor.

4. The diagnosis system of claim 3, wherein
the predetermined work is a machining of a workpiece by a cutting tool with a rotation about a rotation axis of one of the cutting tool and the workpiece with respect to another of the cutting tool and the workpiece,
the motor of the driver device is configured to press one of the cutting tool and the workpiece in a direction along the rotation axis onto another of the cutting tool and the workpiece, and
the specific direction is along the rotation axis.

5. The diagnosis system of claim 3, wherein the predetermined work is a transporting of fluid by an impeller rotating about a rotation axis,
the motor of the driver device is configured to rotate the impeller, and
the specific direction intersects with the rotation axis of the impeller.

6. The diagnosis system of claim 3, wherein
the predetermined work is an attaching of a first component to a second component,
the motor of the driver device is configured to cause the second component to approach the first component in a predetermined direction, and
the specific direction is the predetermined direction.

7. The diagnosis system of claim 3, wherein
the predetermined work is a polishing of an object with a polishing pad,
the motor of the driver device is configured to press a dresser against the polishing pad in a predetermined direction, and
the specific direction is the predetermined direction.

8. The diagnosis system of claim 1, wherein the condition of the apparatus includes a normal condition, an abnormal condition, and an unspecified condition that is neither normal nor abnormal.

9. The diagnosis system of claim 8, wherein, the determination unit determines whether the condition of the apparatus is normal or abnormal in a case where the condition of the apparatus is not in the unspecified condition.

10. The diagnosis system of claim 1, further comprising an extraction unit configured to convert the waveform into a frequency-axis waveform and extract a portion having a possibility of including the change from the frequency-axis waveform,
wherein the determination unit determines the condition of the apparatus based on the portion extracted by the extraction unit.

11. The diagnosis system of claim 10, wherein the determination unit determines the condition of the apparatus from the portion by a learned model.

12. The diagnosis system of claim 1, wherein the measurement unit is attached to an electric wire through which the current flows.

13. A diagnosis system configured to diagnose an apparatus including a driver device, the system comprising:
an acquisition unit configured to acquire waveform data indicating a waveform related to a current to be supplied to the driver device; and
a determination unit configured to
obtain, based on the waveform data, a change caused by a component of a force in
a particular direction applied to the driver device, and
determine a condition of the apparatus based on the obtained change, wherein:
the apparatus is a work device configured to execute a predetermined work,
the current is supplied to the driver device while the apparatus executes the predetermined work,
the force is applied to the driver device while the apparatus executes the predetermined work,
the driver device includes a motor including a rotor,
the force applied to the driver device is applied to the rotor,
the predetermined work is a machining of a workpiece by a cutting tool with a rotation about a rotation axis of one of the cutting tool and the workpiece with respect to another of the cutting tool and the workpiece,
the motor of the driver device is configured to press one of the cutting tool and the workpiece in a direction along the rotation axis onto another of the cutting tool and the workpiece, and
the specific direction is along the rotation axis.

14. The diagnosis system of claim 13, wherein the condition of the apparatus includes a normal condition, an abnormal condition, and an unspecified condition that is neither normal nor abnormal.

15. The diagnosis system of claim 14, wherein, the determination unit determines whether the condition of the apparatus is normal or abnormal in a case where the condition of the apparatus is not in the unspecified condition.

16. The diagnosis system of claim 13, further comprising an extraction unit configured to convert the waveform into a frequency-axis waveform and extract a portion having a possibility of including the change from the frequency-axis waveform,
wherein the determination unit determines the condition of the apparatus based on the portion extracted by the extraction unit.

17. The diagnosis system of claim 16, wherein the determination unit determines the condition of the apparatus from the portion by a learned model.

18. A diagnosis system configured to diagnose an apparatus including a driver device, the system comprising:
an acquisition unit configured to acquire waveform data indicating a waveform related to a current to be supplied to the driver device; and
a determination unit configured to
obtain, based on the waveform data, a change caused by a component of a force in a particular direction applied to the driver device, and
determine a condition of the apparatus based on the obtained change, wherein:
the apparatus is a work device configured to execute a predetermined work, the current is supplied to the driver device while the apparatus executes the predetermined work, the force is applied to the driver device while the apparatus executes the predetermined work, the driver device includes a motor including a rotor, the force applied to the driver device is applied to the rotor, the predetermined work is a transporting of fluid by an impeller rotating about a rotation axis, the motor of the driver device is configured to rotate the impeller, and the specific direction intersects with the rotation axis of the impeller.

19. The diagnosis system of claim 18, wherein the condition of the apparatus includes a normal condition, an abnormal condition, and an unspecified condition that is neither normal nor abnormal.

20. The diagnosis system of claim 19, wherein, the determination unit determines whether the condition of the apparatus is normal or abnormal in a case where the condition of the apparatus is not in the unspecified condition.

21. The diagnosis system of claim 18, further comprising an extraction unit configured to convert the waveform into a frequency-axis waveform and extract a portion having a possibility of including the change from the frequency-axis waveform, wherein the determination unit determines the condition of the apparatus based on the portion extracted by the extraction unit.

22. The diagnosis system of claim 21, wherein the determination unit determines the condition of the apparatus from the portion by a learned model.

23. A diagnosis system configured to diagnose an apparatus including a driver device, the system comprising:

an acquisition unit configured to acquire waveform data indicating a waveform related to a current to be supplied to the driver device; and a determination unit configured to obtain, based on the waveform data, a change caused by a component of a force in a particular direction applied to the driver device, and determine a condition of the apparatus based on the obtained change, wherein:

the apparatus is a work device configured to execute a predetermined work, the current is supplied to the driver device while the apparatus executes the predetermined work, the force is applied to the driver device while the apparatus executes the predetermined work, the driver device includes a motor including a rotor, the force applied to the driver device is applied to the rotor, the predetermined work is an attaching of a first component to a second component, the motor of the driver device is configured to cause the second component to approach the first component in a predetermined direction, and the specific direction is the predetermined direction.

24. The diagnosis system of claim 23, wherein the condition of the apparatus includes a normal condition, an abnormal condition, and an unspecified condition that is neither normal nor abnormal.

25. The diagnosis system of claim 24, wherein, the determination unit determines whether the condition of the apparatus is normal or abnormal in a case where the condition of the apparatus is not in the unspecified condition.

26. The diagnosis system of claim 23, further comprising an extraction unit configured to convert the waveform into a frequency-axis waveform and extract a portion having a possibility of including the change from the frequency-axis waveform, wherein the determination unit determines the condition of the apparatus based on the portion extracted by the extraction unit.

27. The diagnosis system of claim 26, wherein the determination unit determines the condition of the apparatus from the portion by a learned model.

28. A diagnosis system configured to diagnose an apparatus including a driver device, the system comprising:

an acquisition unit configured to acquire waveform data indicating a waveform related to a current to be supplied to the driver device; and a determination unit configured to obtain, based on the waveform data, a change caused by a component of a force in a particular direction applied to the driver device, and determine a condition of the apparatus based on the obtained change, wherein:

the apparatus is a work device configured to execute a predetermined work, the current is supplied to the driver device while the apparatus executes the predetermined work, the force is applied to the driver device while the apparatus executes the predetermined work, the driver device includes a motor including a rotor, the force applied to the driver device is applied to the rotor, the predetermined work is a polishing of an object with a polishing pad, the motor of the driver device is configured to press a dresser against the polishing pad in a predetermined direction, and the specific direction is the predetermined direction.

29. The diagnosis system of claim 28, wherein the condition of the apparatus includes a normal condition, an abnormal condition, and an unspecified condition that is neither normal nor abnormal.

30. The diagnosis system of claim 29, wherein, the determination unit determines whether the condition of the apparatus is normal or abnormal in a case where the condition of the apparatus is not in the unspecified condition.

31. The diagnosis system of claim 28, further comprising an extraction unit configured to convert the waveform into a frequency-axis waveform and extract a portion having a possibility of including the change from the frequency-axis waveform, wherein the determination unit determines the condition of the apparatus based on the portion extracted by the extraction unit.

32. The diagnosis system of claim 31, wherein the determination unit determines the condition of the apparatus from the portion by a learned model.

* * * * *